United States Patent
Scherabon

(10) Patent No.: US 6,222,712 B1
(45) Date of Patent: Apr. 24, 2001

(54) DEVICE HAVING PROCESSOR MEANS AND HAVING UNDERVOLTAGE DETECTION MEANS

(75) Inventor: Christian Scherabon, Klagenfurt (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/342,818

(22) Filed: Jun. 29, 1999

(30) Foreign Application Priority Data

Jun. 30, 1998 (EP) .................................................. 98890186

(51) Int. Cl.[7] ...................................................... H02H 3/24
(52) U.S. Cl. .................................. 361/92; 361/86; 361/90
(58) Field of Search .................................. 361/88, 90, 92; 363/50, 74; 323/276; 702/57, 60

(56) References Cited

U.S. PATENT DOCUMENTS

| | | | |
|---|---|---|---|
| 4,251,883 | * | 2/1981 | Grants et al. ........................... 371/27 |
| 4,428,020 | * | 1/1984 | Blanchard, Jr. ....................... 361/90 |
| 4,890,005 | * | 12/1989 | Schornack ............................. 307/87 |
| 5,513,062 | * | 4/1996 | Paul et al. ............................. 361/90 |

FOREIGN PATENT DOCUMENTS 486 222 A2 * 5/1992 (EP) .

* cited by examiner

Primary Examiner—Michael J. Sherry
Assistant Examiner—Kim Huynh
(74) Attorney, Agent, or Firm—Ernestine C. Bartlett

(57) ABSTRACT

In a device means having connections means for applying a direct voltage (DCV) and having an undervoltage detection circuit (31), a control voltage (CV) having two different direct voltage values (V5, V6) can be applied via the connection elements (2) and the undervoltage detection circuits (3) can generate a detection signal (DS) which alternates between two different voltage values (V1, V2) similarly to the two direct voltage values (V5, V6). A transition detector (58) is part of a processor (16) , The transaction detectr is means are adapted to detect transitions (TR) between the two values (V1, V2) of the detection signal and by which at least one given program sequence can be started in the processor upon the detection of such transitions.

5 Claims, 3 Drawing Sheets

DEVICE HAVING PROCESSOR MEANS AND HAVING UNDERVOLTAGE DETECTION MEANS

BACKGROUND OF THE INVENTION

This invention relates to a device having connection means to which a direct voltage source for the power supply of the device can be connected, and having a circuit powered with a d.c. supply voltage, which can be obtained by means of the direct voltage source, and which includes processor means by which different program sequences can be executed, and which circuit includes undervoltage detection means by which it is possible to detect whether the d.c. supply voltage exceeds or is below a given threshold value and which are adapted to generate a detection signal, which alternates between two values depending on whether the d.c. supply voltage exceeds or decreases below the threshold value, and which have a detection signal output connected to a detection signal input of the processor means and from which the detection signal which alternates between two values, can be applied to the detection signal input of the processor means.

Such a device in the form of an appliance, namely in the form of kitchen scales having the type designation HR2385, is commercially available from the Applicant and is consequently known. For the known appliance—as well as for many other appliances—it is necessary to run certain program sequences in the processor means before the appliance can be put on the market. An example of such a program sequence is a test program sequence which must be carried out in the course of the production or towards the end of the production of such an appliance in order to test the correct operation of such processor means and, as a consequence, of the appliance. In order to start the execution of such a program sequence the known appliance requires additional means, such as test probes for the application of a start signal, holes in the housing of the appliance, through which holes the test probes can be brought into contact with a printed circuit board in the appliance in order to apply the start signal, but these holes are undesirable in view of the possibility of the ingress of moisture or liquids into the interior of the appliance housing, and a separate start terminal for the processor means. These additional means form a substantial expenditure and have drawbacks.

SUMMARY OF THE INVENTION

It is an object of the invention to preclude the aforementioned problems and to provide an improved device of the type defined in the opening paragraph.

According to the invention, in order to achieve the aforementioned object in a device of the type defined in the opening paragraph, a control signal source can be connected to the connection means and can apply a control signal to the connection means, which control signal alternates between at least two direct voltage values within a given time interval, and the undervoltage detection means are adapted to produce on their detection signal output, within the given time interval, a detection signal which alternates between two values similarly to the two direct voltage values of the control signal and can be applied from the detection signal output to the detection signal input of the processor means, and transition detection means are realized by the processor means, which transition detection means are adapted to detect the occurrence of at least one transition between the two values of the detection signal within the given time interval and by which, after a detection of such an occurrence of at least one transition between the two values of the detection signal, the processor means can be controlled so as to execute at least one given program sequence. By means of the measures in accordance with the invention it is achieved in a particularly simple manner that by applying a control signal which alternates between two direct voltage values, using undervoltage detection means which are present anyway, a detection signal which alternates between two values can be generated and can be applied to a detection signal input of the processor means, the transition detection means of the processor means enabling at least one transition occurring between the two values of the detection signal to be detected and, after the occurrence of at least one transition between the two values of the detection signal has been detected, the transition detection means enabling the processor means to be activated so as to execute a desired program sequence, for example, a test program sequence, or a calibration program sequence, or any other adjustment program sequence. In a device in accordance with the invention the connection means, which are available anyway for the connection of a direct voltage source, are advantageously used in addition for the application of a control signal, which has the advantage that a device in accordance with the invention need not be provided with separate passages or holes in the housing of the device in order to start a desired program sequence in the processor means with the aid of, for example, test probes.

It has proved to be particularly advantageous to take the measures defined in claims 2, 3, 4 and 5 in a device in accordance with the invention. This is because these measures appear to be particularly simple and favorable for implementation with the aid of processor means.

The afore-mentioned aspects as well as further aspects of the invention will be apparent from the embodiment described hereinafter by way of example and will be elucidated with reference to this example.

BRIEF DESCRIPTION OF THE DRAWING

The invention will now be described in more detail with reference to the drawings, which show two embodiments, given by way of example, to which the invention is not limited.

DESCRIPTION OF THE PREFERRED EMBODIMENTS

Figure 1:
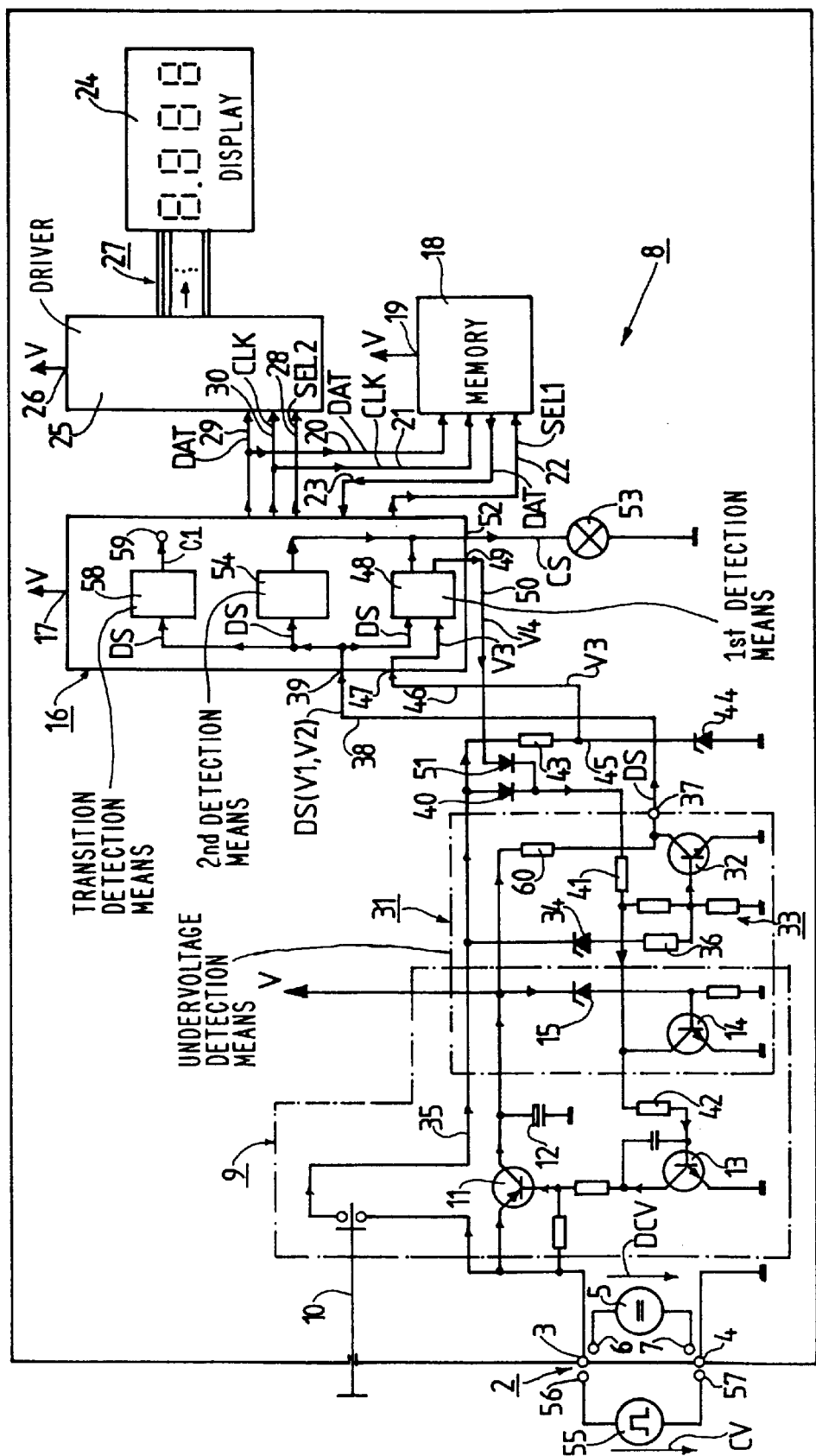
FIG. 1 is a block diagram which diagrammatically shows a relevant part of a device in accordance with a first embodiment of the invention.

FIG. 1 shows a device in accordance with the invention, namely an appliance 1, which in the present case takes the form of kitchen scales.

The appliance 1 has connection means 2, which basically comprise a first terminal contact 3 and a second terminal contact 4. The connection means 2 serve for the connection of a direct voltage source 5 for the power supply of the appliance 1. In the present case, the direct voltage source 5 is realized by means of batteries, which supply a direct voltage DCV having a value of 9 V. The batteries can be placed into the appliance 1 in known manner, two battery contacts 6 and 7 being engageable with the terminal contacts 3 and 4 of the connection means 2 so as to establish an electrically conductive connection.

The appliance 1 further comprises a circuit 8, whose circuit arrangement will be described in more detail hereinafter. It is to be noted that FIG. 1 shows only the relevant part of the whole circuit of the appliance 1.

The circuit 8 can be powered by means of a d.c. supply voltage V, which can be obtained by means of the direct voltage source 5. In order to obtain the d.c. supply voltage V the appliance 1 has power supply activation means 9. The power supply activation means 9 comprise a push-button 10 for turning on the appliance 1, which when operated, i.e. when activated, can be brought into an electrically conductive switching state. The power supply activation means 9 further comprise a switching transistor 11 whose emitter is connected to the first terminal contact 3 and whose collector is connected to a capacitor 12 for storage purposes. The d.c. supply voltage V can be taken from the collector of the switching transistor 11 and can be applied to those circuit sections of the circuit 8 which require the d.c. supply voltage V for their power supply.

The power supply activation means 9 further comprise a control transistor 13 by means of which the switching transistor 11 can be controlled. The power supply activation means 9 further comprise a regulator transistor 14 which, in conjunction with a first zener diode 15 connected to its base, regulates the direct voltage value of the d.c. supply voltage V, namely so as to maintain it at a value of approximately 5.1 V.

The circuit 8 of the appliance 1 includes processor means 16 formed by a commercially available microprocessor. The d.c. supply voltage V can be applied to a power supply input 17 of the processor means 16. The processor means 16 can carry out different program sequences, but this will not be described any further because this is generally known per se.

The circuit 8 further comprises memory means 18 having a power supply input 19 to which the d.c. supply voltage V can be applied. With the aid of the processor means 16, in that a given program sequence is run in the processor means 16, data DAT can be applied to the memory means 18 via a first data line 20 and can be loaded therein, the memory means 18 being arranged receive a clock signal CLK via a first clock signal line 21. To enable such a loading of data DAT into the memory means 18, the processor means 16 should apply a first selection signal SEL1 to the memory means 18 via a first selection line 22 prior to such a loading operation. After a selection of the memory means 18 with the aid of the first selection signal SEL1 it is also possible to read data DAT out of the memory means 18, and such read-out data DAT can be applied to the processor means 16 via a second data line 23. In the present case, the memory means 18 are formed by an EEPROM, but it can be implemented in another manner.

The circuit 8 further comprises display means 24, in the present case formed by a so-called 7-segment display device. For driving and powering the display means 24 the circuit 8 comprises driver means 25 having a power supply input 26 to which, likewise, the d.c. supply voltage V can be applied. The drive means 25 and the display means 24 are connected to one another by a multitude of lines 27, which will not be described in further detail.

To activate the driver means 25 the processor means 16 can supply a second selection signal SEL2 to the driver means 25 via a second selection line 28. Moreover, data DAT can be applied to the driver means 25 via a third data line 29 and the clock signal CLK can also be applied to the driver means 25 via a second clock signal line 30. The data DAT applied to the driver means 25 can be processed and converted into corresponding drive signals by the driver means 25, which drive signals can be applied to the display means 24 via the lines 27 to drive the display means 24 in such a manner that they display information corresponding to the applied data DAT.

The circuit 8 further comprises undervoltage detection means 31 by means of which it is possible to detect whether the d.c. supply voltage V exceeds or falls below a given threshold value THV, i.e. whether the d.c. supply voltage V has a direct voltage value within a voltage range above this given threshold value THV or a direct voltage value within a voltage range below this given threshold value THV. This means, in other words, that the undervoltage detection means 31 are configured to detect in a simple and reliable manner whether the d.c. supply voltage V lies in a useful range above the threshold value THV, in which an adequate power supply of the relevant circuit sections by means of the d.c. supply voltage V is guaranteed, or in a so-called undervoltage range below the threshold value, in which the supply voltage V has an inadequate direct voltage value, as a result of which a correct power supply of the relevant circuit sections with the d.c. supply voltage V is not guaranteed.

In the present case, the undervoltage detection means 31 also include the regulator transistor 14 and the first zener diode 15, which cooperates with the regulator transistor 14. The undervoltage detection means 31 further comprise a detection transistor 32 whose base is connected to a base voltage divider 33 arranged in parallel with the emitter-collector path of the regulator transistor 14. The collector of the detection transistor 32 is connected to the collector of the switching transistor 11, i.e. to the capacitor 12, via a series resistor 60, as a result of which the d.c. supply voltage V is supplied to the series resistor 60.

The undervoltage detection means 31 further comprise a second zener diode 34 having one end connected to the push-button 10 via an activation line 35 and having its other end connected to the base of the detection transistor 32 via a first resistor 36. The collector of the detection transistor 32 is connected to a detection signal output 37 of the undervoltage detection means 31. The undervoltage detection means 31 are adapted to generate a detection signal DS which alternates between two values, in the present case between two direct voltage values V1 and V2, depending on whether the d.c. supply voltage V exceeds or lies below the threshold value THV. In the present case, V1=approximately 0 V and V2=approximately 5.0 V.

The detection signal output 37 is connected to a first detection signal input 39 of the processor means 16 via first detection signal line 38, as a result of which the detection signal DS which alternates between two values, i.e. the two direct voltage values V1 and V2, can be applied from the detection signal output 37 to the detection signal input 39 of the processor means 16 via the detection signal line 38.

It is to be noted that the circuit 8 further includes a first diode 40 connected to the push-button 10 via the activation line 35, which diode is connected to the base of the control transistor 13 via a second resistor 41 and a third resistor 42.

The push-button 10 is further connected to a fourth resistor 43 via the activation line 35, the other end of the fourth resistor being connected to a third zener diode 44, as a result of which a d.c. detection voltage V3, which is proportional to the d.c. supply voltage V and which is limited by the third zener diode 44, is available on the node 45 between the fourth resistor 43 and the third zener diode 44 and can be applied to a second detection signal input 47 of the processor means 16 via a second detection signal line 46.

With the aid of the processor means 16 a multitude of means, measures and functions are implemented, of which only the means, measures and functions which are relevant will be described in more detail.

With the aid of the processor means 16 first detection means 48 are formed, to which means the detection signal DS (V1, V2) is supplied via the first detection signal input 39 and to which the d.c. detection voltage V3 is supplied via the second detection signal input 47. The first detection means 48 are capable of detecting whether the detection signal DS (V1, V2) has its smaller direct voltage value V1 or its larger direct voltage value V2 and whether the d.c. detection voltage V3 is available or is not available.

When the detection signal DS (V1, V2) has its smaller value V1 and the d.c. detection voltage V3 is available, this means that the push-button 10 has been operated, i.e. activated or closed, and that an adequate battery voltage DCV is available when the push-button 10 is actuated, i.e. when the appliance 1 is turned on. In this case, the first detection means 48 supply a d.c. holding voltage V4 to a first control output 49 of the processor means 16, which can be applied to the base of the control transistor 13 via a holding line 50, a second diode 51, the second resistor 41 and the third resistor 42, as a result of which the previously turned-on control transistor 13 is held in its conductive state. Thus, a self-holding circuit is formed with the aid of the first detection means 48 and the second diode 51, which ensures that the switching transistor 11 remains conductive after the push-button 10 has been released. The first detection means 48 are operative only for as long as the push-button 10 is pressed, i.e. activated, and the d.c. detection voltage V3 is consequently available. As soon as the push-button 10 is released and, as a consequence, the d.c. detection voltage V3 disappears, the first detection means 48 are deactivated.

When upon activation of the push-button 10 the d.c. detection voltage V3 occurs but the detection signal DS (Vi, V2) on the detection signal output 37 of the undervoltage detection means 31 has its high direct voltage value V2, which means that the value of the battery voltage DCV is too low, this results in the presence of the d.c. detection voltage V3 and the simultaneous presence of the high direct voltage value V2 of the detection signal DS (V1, V2) being detected by the first detection means 48. In this case, the first detection means 48 produce a control signal CS on a second control output 52 of the processor means 16, which control signal can be applied to an optical warning indicator means 53 connected to the second control output 52. The control signal CS can be, for example, a pulse-shaped signal, which results in blinking of the warning indicator means 53. Such blinking is an indication for the user of the appliance 1 that the direct voltage DCV supplied by the direct voltage source 5, i.e. by the batteries, already has a comparatively low direct voltage value, so that a battery change is imminent. Together with the control signal CS applied to the second control output 52 the first detection means 48 can further generate control information which can be used internally in the processor means 16 for various control and switch-off purposes, which will not be described any further.

Moreover, second detection means 54 are realized with the aid of the processor means 16 which can also receive the detection signal DS (V1, V2) applied to the first detection signal input 39. The second detection means 54 serve to detect whether the detection signal DS (V1, V2) applied to it has its higher direct voltage value V2 or its lower direct voltage value V1, namely after the push-button 10 for switching on the appliance 1 has been released again, i.e. has been deactivated after its actuation or activation, i.e. whether the appliance 1 is in its normal operating condition after switching on of the appliance 1. If the detection signal DS (V1, V2) has its lower direct voltage value V1, this means that an adequate d.c. supply voltage V is available. In this case, the second detection means 54 do not produce a control signal CS on the second control output 52 of the processor means 16. However, if the second detection means 54 detect that the detection signal DS (V1, V2) applied to it has its higher direct voltage value V2, the second detection means 54 also produce a control signal CS on the second control output 52 of the processor means 16, which again causes the warning indicator means 53 to blink, which is an indication for the user of the appliance 1 that the direct voltage source 5 now supplies an inadequate direct voltage DCV during operation of the appliance 1. In this case, the second detection means 54 supply control information for internal use in the processor means 16, similarly to the first detection means 48 as described hereinbefore, which information for example causes the operation of the processor means 16 and hence of the appliance 1 to be terminated, but this will not be described any further.

The operation of the device will now be explained hereinafter.

When a user of the appliance 1 actuates the push-button 10 in order to turn on the appliance 1 and in the appliance 1 the direct voltage source 5 then supplies an inadequate direct voltage DCV, the control transistor 13 and, consequently, the switching transistor 11 are turned on via the first diode, the second resistor 41 and the third resistor 42 and, as a result of this, a d.c. supply voltage V is available from the capacitor 12, but the second zener diode 34 is in a non-conductive state, as a result of which the detection transistor 32 is also in its non-conductive state and, consequently, the higher direct voltage value V2 of the detection signal DS is produced on the detection signal output 37. This further results in the d.c. detection voltage V3 being generated by means of the fourth resistor 43 and the third zener diode 44. Both the higher direct voltage value V2 of the detection signal DS and the d.c. detection voltage V3 are applied to the first detection means 48, which detect the presence of the d.c. detection voltage V3 and the higher direct voltage value V2 of the detection signal DS and thus detect that the direct voltage source 5 supplies an inadequate direct voltage DCV, as a result of which the first detection means 48 apply the control signal CS, for driving the warning indicator means 53, to the second control output 52 of the processor means 16, but no d.c. holding voltage V4 is applied to the first control output 49, so that the control transistor 13 and the switching transistor 11 are not held in their conductive states via the second diode 51. The warning indicator means 53 give an indication to the user, who has just actuated the push-button 10, that the direct voltage source 5 already supplies a comparatively low direct voltage DCV.

When a user actuates the push-button 10 and, in contradistinction to the situation described above, the direct voltage source 5 supplies an adequate direct voltage DCV, this causes the control transistor 13 and the switching transistor 11 to be turned on via the first diode 40 and the two resistors 41 and 42, as a result of which a correct d.c. supply voltage V is available across the capacitor 12 and, furthermore, the second zener diode 34 is turned on, which causes the detection transistor 32 also to be turned on and, consequently, the lower direct voltage value V1 of the detection signal DS to be produced on the detection signal output 37. Moreover, in this case the fourth resistor 43 and the third zener diode 44 also generate a d.c. detection voltage V3 on the node 45. Both the lower direct voltage value V1 of the detection signal DS and the d.c. detection voltage V3 are applied to the first detection means 48, after which the first detection means 48 supply the d.c. holding voltage V4 to the first control output 49, which holding voltage ensures that the control transistor 13 and, as a consequence, the switching transistor 11 are held in their conductive states via the second diode 51 and the resistors 41 and 42.

In this way, normal operation of the appliance 1 is now possible. The d.c. supply voltage V is constantly regulated with the aid of the first zener diode 15 and the regulator transistor 14 so as to maintain it at a desired value, which is approximately 5.1 V in the present case.

During such normal operation the d.c. supply voltage V is constantly monitored by the undervoltage detection means 31. As long as the d.c. supply voltage V has an adequately high level the first zener diode 15 remains in its conductive state and, consequently, the control transistor 14 also remains in its conductive state. As a result of this, the detection transistor 32 is turned off via the base voltage divider 33, as a result of which the lower direct voltage value V1 on the detection signal DS appears on the detection signal output 37 of the undervoltage detection means 31 and is applied to the first detection signal input 39 of the processor means 16 and, in the present case, the second detection means 54 via the first detection signal line 38. The second detection means 54 then detect the lower direct voltage value V1 of the detection signal DS, as a result of which it is ascertained that the direct voltage source 5 provides a correct power supply condition and therefore no influencing of the processor means 16 and the appliance 1 and no warning indication for the user are necessary.

When the d.c. supply voltage V decreases below a level required for a correct power supply of the circuit 8, this causes the first zener diode 15 to be cut off, as a result of which the regulator transistor 14 is also turned off. This, in its turn, causes the detection transistor 32 to be turned off via the base voltage divider 33, as a result of which the higher direct voltage value V2 of the detection signal DS appears on the detection signal output 37 of the undervoltage detection means 31 and is applied to the first detection signal input 39 of the processor means 16 and, in the present case, the second detection means 54 via the first detection switching signal line 38. The second detection means 54 then detect the higher direct voltage value V2 of the detection signal DS, as a result of which the second detection means 54 supply the control signal CS, for driving the warning indicator means 53, to the second control output 52 of the processor Means 16, which thus causes the warning indicator means 53 to blink in order to warn the user.

Figure 2:
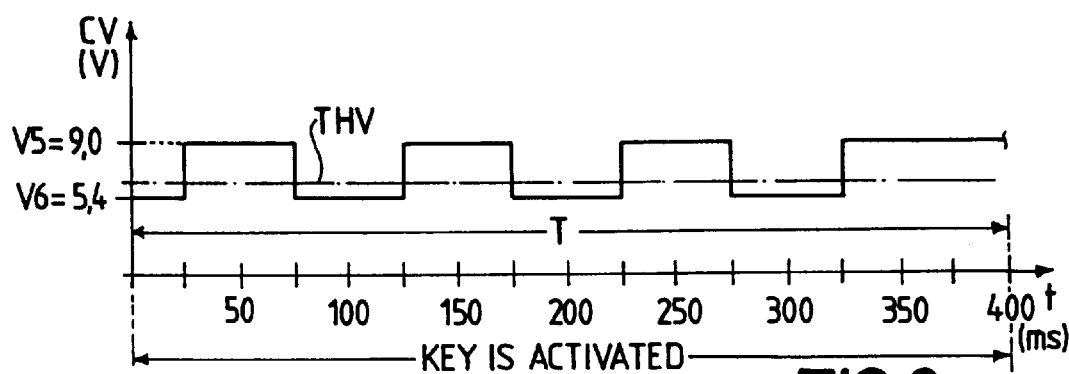
FIGS. 2 and 3 show waveform diagrams of a control signal and a detection signal which occur in the device shown in FIG. 1.

In the appliance 1 the presence of the connection means 2 enables a control signal source 55 to be connected to the connection means 2 in a simple manner, namely by means of signal source contacts 56 and 57. The control signal source 55 is designed in such a manner that—as is shown in FIG. 2—it can apply a control signal CV to the connection means 2, which control signal is switchable between at least two direct voltage values V5 and V6 (V5=approximately 9.0 V and V6=approximately 5.4 V) within a given time interval T. When such a control signal CV is applied to the connection means 2 within the given time interval T while during this time interval T—as is also indicated in FIG. 2—the push-button 10 is activated, this guarantees in an advantageous manner that the undervoltage detection means 31 can produce a detection signal DS at the detection signal output 37 within the given time interval T, which alternates between two values V1 and V2 shown in FIG. 3, in conformity with the two direct voltage values V5 and V6 of the control signal CV shown in FIG. 2. As is apparent from FIG. 2, the time interval T is 400 ms in this case and the direct voltage value V5 lies above the threshold value THV and the direct voltage value V6 lies below the threshold THV. In the present case, the different values V1 and V2 of the detection signal DS are direct voltage values. The detection signal DS shown in FIG. 3 can be applied from the detection signal output 37 of the undervoltage detection means 31 to the first detection signal input 39 of the processor means 16.

Figure 3:
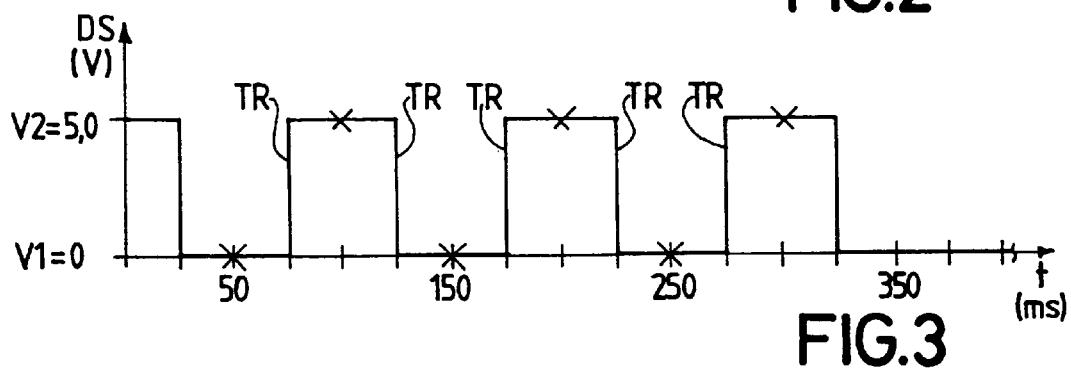

In the appliance 1 shown in FIG. 1, transition detection means 58 are realized by the processor means 16 in an advantageous manner, i.e. substantially without any additional elements. The transition detection means 58 are adapted to detect—as can be seen in FIG. 3—the occurrence of at least one transition TR between the two values V1 and V2 of the detection signal DS within the given time interval T. The solution adopted for the detection of such a transition TR in the present case is that the direct voltage value of the detection signal DS before such a transition TR and the direct voltage value of the detection signal DS after such a transition TR is detected with the aid of the transition detection means 58 at given instants, marked "x" in FIG. 3, and the occurrence of a transition TR is determined from these values.

In the appliance 1 shown in FIG. 1. the transition detection means 58 are adapted to detect a given number of transitions TR between the two direct voltage values V2 and V1 and V2 of the detection signal DS, the transition detection means 58 being adapted to detect five transitions TR between the two direct voltage values V1 and V2 of the detection signal DS.

After a detection of the an occurrence of at least one transition TR between the two direct voltage values V1 and V2 of the detection signal DS, the transition detection means 58 can generate control information CI, the information generated by the transition detection means 58 being available on an output 59 of the transition detection means 59, which output is shown symbolically in FIG. 1, and which enables the processor means 16 to be controlled so as to execute a given program sequence. The control information CI can, for example, start a program sequence for a test process or a program sequence for a calibration process and the like.

In the appliance 1 shown in FIG. 1 the control information CI supplied by the transition detection means 58 is dependent on the detected number of transitions TR between the two direct voltage values Vi and V2 of the detection signal DS and, depending on the supplied control information CI, a program sequence corresponding to the relevant control information CI can be started. This means, in other words, that the transition detection means 58 can control the processor means 16 so as to carry out a given program sequence corresponding to the number of transitions TR detected by the transition detection means 58, i.e. between the two direct voltage values V1 and V2 of the detection signal DS.

In an appliance 1 as shown in FIG. 1, it is achieved in a particularly simple manner that with the aid of the undervoltage detection means 31, which are present anyway, and of the processor means 16, which are present anyway, the execution of at least one program sequence can be started by the application of a control signal CV to the connection means 2, which are present anyway, in a very simple manner and without the use of any additional elements.

Figure 4:
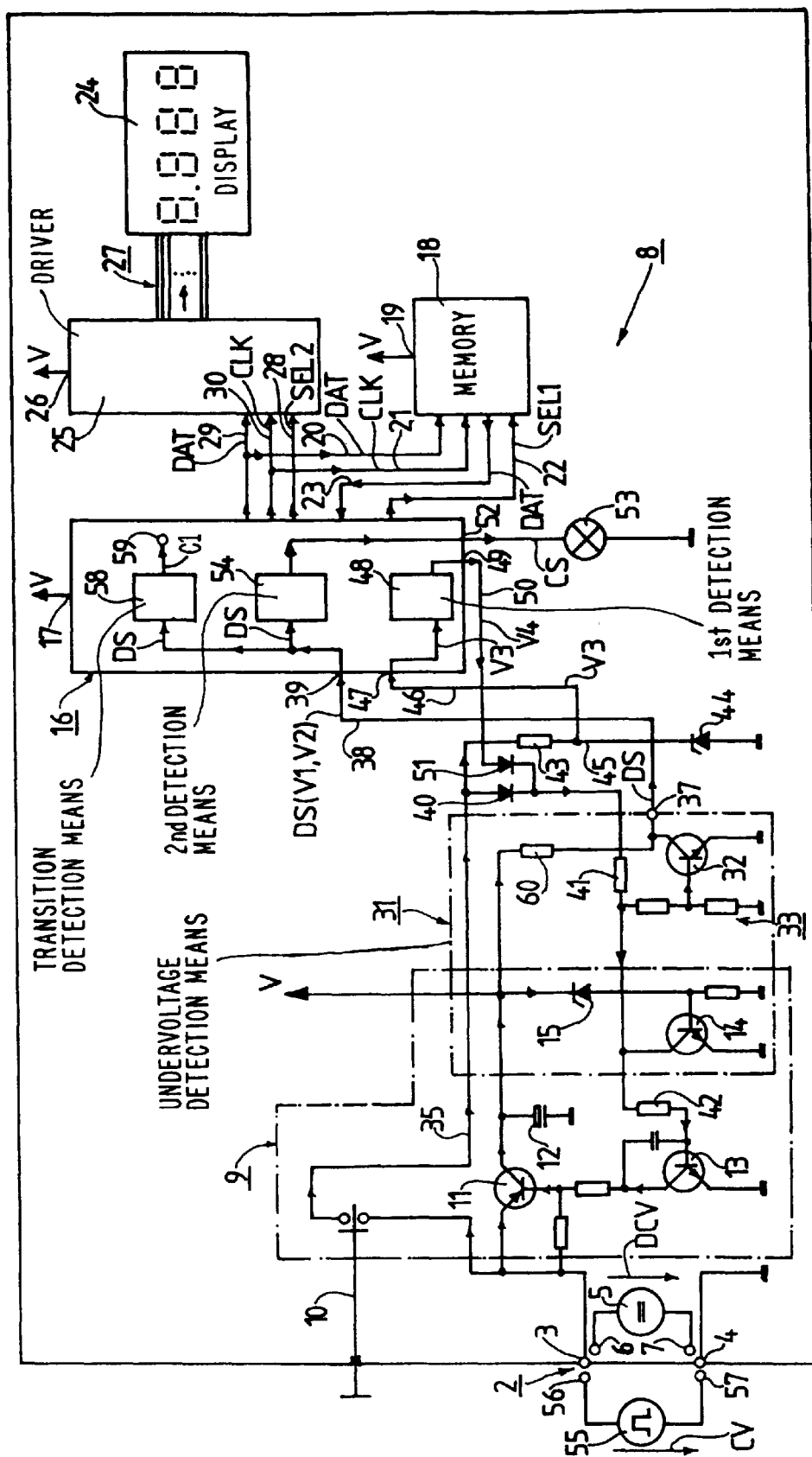
FIG. 4 is a block diagram which diagrammatically shows a relevant part of a device in accordance with a second embodiment of the invention.

FIG. 4 shows a device in accordance with the invention, namely an appliance 1, in a second embodiment of the invention, whose circuit 8 basically corresponds to the circuit 8 of the appliance 1 shown in FIG. 1, the difference being that the second zener diode 34 and the first resistor 36 provided in the circuit 8 of the appliance 1 shown in FIG. 1 have not been provided in the circuit 8 of the appliance 1 shown in FIG. 4. As a result of this simplification, the detection signal DS (V1, V2) cannot be applied to the first detection means 48 in the processor means 16 of the circuit 8 of the appliance 1 shown in FIG. 4 and the first detection means 48 cannot apply a control signal CS to the warning indicator means 53. Owing to this simplified circuit arrangement it is not possible in the appliance 1 shown in FIG. 4 to produce a blinking signal when the direct voltage DCV supplied by the direct voltage source 5 is already too low when the appliance 1 is switched on by means of the push-button 10.

Figure 5:
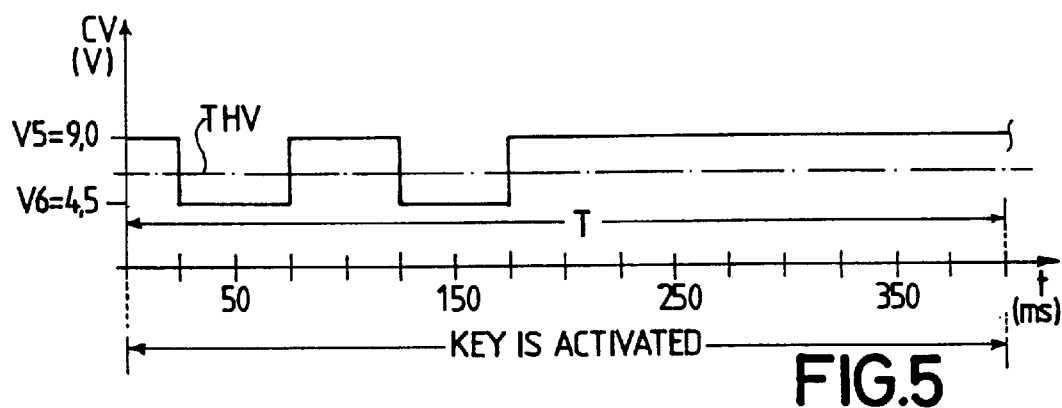
FIGS. 5 and 6 show waveform diagrams of a control signal and a detection signal which occur in the device shown in FIG. 4.
Figure 6:
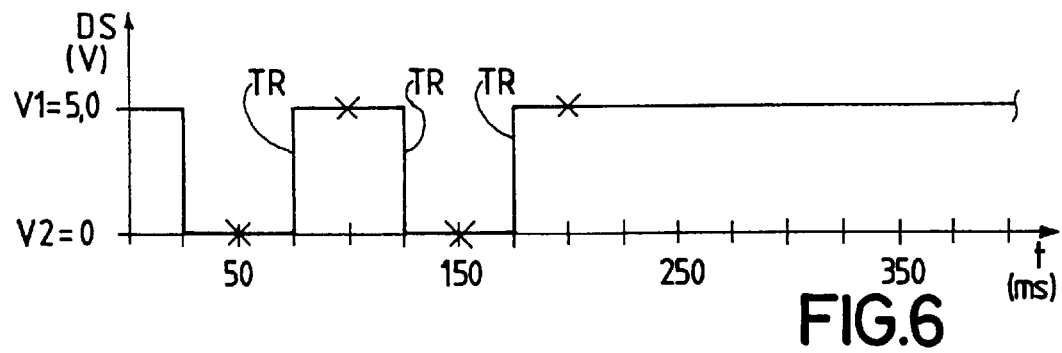

For the rest, the circuit 8 of the appliance 1 shown in FIG. 4 essentially operates in the same way as the circuit 8 of the appliance 1 shown in FIG. 1. One difference resides in the fact that the direct voltage value V6 of the control signal CV is approximately 4.5 V, as is shown in FIG. 5. Another difference—though not essential—is that in the appliance 1 shown in FIG. 4—as can be seen in FIGS. 5 and 6—the detection signal DS is in phase with the control signal CV, whereas in the appliance 1 shown in FIG. 1—as can be seen in FIGS. 2 and 3—the detection signal DS is in phase opposition to the control signal CV, which can be attributed to the fact that in the appliance 1 shown in FIG. 1 the action of the second zener diode 34 and the first resistor 36 at the base of the detection transistor 32 has priority over the action of the base voltage divider 33 on the base of the detection transistor 32. A further difference is that in the appliance 1 shown in FIG. 4 the transition detection means 58 are adapted to detect three transitions TR between the two values V2 and V1 of the detection signal DS, as is shown in FIG. 6 and likewise marked with an "x".

In the two devices in accordance with the invention described hereinbefore, the undervoltage detection means 31 can produce at the detection signal output 37 a detection signal DS which alternates between two direct voltage values V1 and V2 corresponding to the two direct voltages value V5 and V6 of the control signal CV within a given time interval T. It is to be noted that undervoltage detection means 31 may also be adapted so as to supply a detection signal whose frequency alternates between two frequency values corresponding to the two direct voltage value V5 and V6 of the control signal CV or a detection signal whose duty cycle alternates between two duty cycle values corresponding to the two direct voltage values V5 and V6 of the control signal CV. The transition detection means 58 are then adapted analogously to detect transitions between two frequencies or to detect transitions between two duty cycles. Furthermore, it is to be noted that an appliance 1 in accordance with the invention may also include a control signal source 55 integrated in the appliance, which source can be activated selectively by a user, so that a user can always activate at least one desired program sequence in the processor means 16 of the device 1, for example, to carry out a taring process which is to be carried out anew each time by the processor means 16 when the device 1 in accordance with the invention takes the form of kitchen scales or bathroom scales. Instead of optical warning indicator means it is also possible to use acoustic warning indicator means.

What is claimed is:

1. A device (1) comprising:

connection means for connection to a direct voltage source for the power supply of the device, a circuit powered with a d.c. supply voltage obtained by means of the direct voltage source, and which comprises;

processor means by which different program sequences can be executed, undervoltage detection means for detecting whether the d.c. supply voltage exceeds or is below a given threshold value and adapted to generate a detection signal (DS) which alternates between two values (V1, V2) depending on whether the d.c. supply voltage exceeds or is below the threshold value, and which has a detection signal output connected to a detection signal input of the processor means and which applies the detection signal, which alternates between two values (V1, V2), to the detection signal input of the processor means, characterized in that a control signal source can be connected to the connection means and can apply a control signal (CV) to the connection means, which control signal alternates between at least two direct voltage values (V5, V6) within a given time interval (T), and the undervoltage detection means is adapted to produce at said detection signal output, within the given time interval, a detection signal which alternates between two values (V1, V2) corresponding to the two direct voltage values (V5, V6) of the control signal, and which is applied from the detection signal output to the detection signal input of the processor means, and the processor means include transition detection means adapted to detect the occurrence of at least one transition (TR) between the two values (V1, V2) of the detection signal (DS) within the given time interval and whereby, after detection of such an occurrence of at least one transition between the two values (V1, V2) of the detection signal (DS), the processor means is controlled so as to execute at least one given program sequence.

2. A device as claimed in claim 1, wherein, the transition detection means detect a given number of transitions (TR) between the two values (V1, V2) of the detection signal (DS), and the transition detection means control the processor means so as to execute at least one given program sequence in accordance with the number of transitions (TR) occurring between the two values (V1, V2) of the detection signal.

3. A device as claimed in claim 2, wherein, the transition detection means detect three transitions (TR) between the two values of the detection signal.

4. A device as claimed in claim 2, wherein, the transition detection means detect five transitions (TR) between the two values of the detection signal.

5. A device as claimed in claim 1, wherein the undervoltage detection means generate a detection signal which alternates between at least two direct voltage values, and the transition detection means (58) detect the occurrence of at least one transition (TR) between the two direct voltage values of the detection signal.

* * * * *